United States Patent
Duqi et al.

(10) Patent No.: US 11,555,554 B2
(45) Date of Patent: Jan. 17, 2023

(54) MEMBRANE MICROFLUIDIC VALVE WITH PIEZOELECTRIC ACTUATION AND MANUFACTURING PROCESS THEREOF

(71) Applicant: STMicroelectronics S.r.l., Agrate Brianza (IT)

(72) Inventors: Enri Duqi, Milan (IT); Lorenzo Baldo, Bareggio (IT)

(73) Assignee: STMicroelectronics S.r.l., Agrate Brianza (IT)

(*) Notice: Subject to any disclaimer, the term of this patent is extended or adjusted under 35 U.S.C. 154(b) by 255 days.

(21) Appl. No.: 16/842,474

(22) Filed: Apr. 7, 2020

(65) Prior Publication Data

US 2020/0326010 A1    Oct. 15, 2020

(30) Foreign Application Priority Data

Apr. 15, 2019  (IT) .................. 102019000005804

(51) Int. Cl.
*F16K 99/00* (2006.01)
*F16K 31/00* (2006.01)
(Continued)

(52) U.S. Cl.
CPC .......... *F16K 31/005* (2013.01); *B23P 15/001* (2013.01); *H01L 41/0973* (2013.01); *F16K 99/0015* (2013.01); *F16K 99/0048* (2013.01)

(58) Field of Classification Search
CPC ....... Y10T 137/0491; Y10T 137/87314; F16K 99/0005; F16K 99/0015; F16K 99/0048;
(Continued)

(56) References Cited

U.S. PATENT DOCUMENTS 5,914,507 A * 6/1999 Polla .................. H01L 41/0973
73/DIG. 1
6,003,833 A * 12/1999 Tasi ..................... F16K 99/0005
251/118
(Continued)

FOREIGN PATENT DOCUMENTS

CN  202100824 U   1/2012
CN  104169583 A  11/2014
(Continued)

OTHER PUBLICATIONS

Li et al., "Fabrication of a high frequency piezoelectric microvalve," *Sensors and Actuators A 1 1 1*, 2004, pp. 51-56.

*Primary Examiner* — Matthew W Jellett
(74) *Attorney, Agent, or Firm* — Seed IP Law Group LLP

(57) ABSTRACT

A microfluidic valve formed in a body having a first and a second surface; an inlet channel extending in the body from the second surface; a first transverse channel extending in the body in a transverse direction with respect to the inlet channel; and an outlet channel extending in the body from the first surface. The inlet channel, the first transverse channel and the outlet channel form a fluidic path. The microfluidic valve further has an occluding portion, formed by the body and extending over the transverse channel; and a piezoelectric actuator coupled to the occluding portion and configured to move the occluding portion from an opening position of the valve, where the occluding portion does not interfere with the fluidic path, and a closing position of the valve, where the occluding portion interferes with and interrupts the fluidic path.

21 Claims, 8 Drawing Sheets

(51) Int. Cl.
*B23P 15/00* (2006.01)
*H01L 41/09* (2006.01)

(58) Field of Classification Search
CPC .... F16K 2099/008; F16K 31/005; F16K 1/00; B23P 15/001; H01L 41/0973
See application file for complete search history.

(56) References Cited

U.S. PATENT DOCUMENTS

| | | | | |
|---|---|---|---|---|
| 6,142,444 | A * | 11/2000 | Kluge | F15C 5/00 |
| | | | | 137/831 |
| 6,227,824 | B1 * | 5/2001 | Stehr | F04B 7/04 |
| | | | | 417/540 |
| 6,883,774 | B2 * | 4/2005 | Nielsen | F15C 5/00 |
| | | | | 251/331 |
| 6,981,518 | B2 * | 1/2006 | Gilbert | G05D 7/0694 |
| | | | | 251/65 |
| 7,025,324 | B1 * | 4/2006 | Slocum | F16K 99/0051 |
| | | | | 251/231 |
| 7,928,960 | B2 * | 4/2011 | Baldo | G06F 3/0338 |
| | | | | 345/169 |
| 9,546,743 | B2 * | 1/2017 | Livermore-Clifford | ...................... F16K 99/0009 |
| 9,574,674 | B2 * | 2/2017 | Maeda | F16K 15/144 |
| 10,197,189 | B2 | 2/2019 | Pugliese et al. | |
| 10,480,502 | B2 * | 11/2019 | Hirata | F04B 43/04 |
| 2003/0172975 | A1 | 9/2003 | Gilbert et al. | |
| 2008/0261345 | A1 | 10/2008 | Villa et al. | |
| 2009/0116116 | A1 | 5/2009 | Tomikawa et al. | |
| 2010/0197189 | A1 | 8/2010 | Jin et al. | |
| 2013/0068325 | A1 * | 3/2013 | Herz | F04B 43/14 |
| | | | | 251/359 |

FOREIGN PATENT DOCUMENTS

| | | |
|---|---|---|
| CN | 106915722 A | 7/2017 |
| CN | 109278407 A | 1/2019 |
| CN | 212480133 U | 2/2021 |
| EP | 1331538 A1 | 7/2003 |
| EP | 1 577 656 A1 | 9/2005 |

\* cited by examiner

MEMBRANE MICROFLUIDIC VALVE WITH PIEZOELECTRIC ACTUATION AND MANUFACTURING PROCESS THEREOF

BACKGROUND

Technical Field

The present disclosure relates to a membrane microfluidic valve with piezoelectric actuation and to the manufacturing process thereof.

Description of the Related Art

As is known, microfluidic valves are fundamental components of microfluidic systems which allow to control of the routing, the timing, and the separation of fluids in a microfluidic system. In particular, it is possible to distinguish between passive microfluidic valves, e.g., driven only by pressure differences which may be used, for example, as non-return valves, and controlled microfluidic valves, which can be opened or closed by means of dedicated actuator devices, which generally operate in a way largely independent of the pressure conditions.

Microfluidic valves can be used in microfluidic circuits and devices in various sectors, for example to provide microreactors, systems for biochemical analyses (for example, Labs-on-Chip for handling individual cells, systems for analysis of drugs or other substances, for example glucose, in biological fluids), ink-jet print heads, cooling systems for microprocessors and fuel microcells.

An example of a known microfluidic valve is schematically shown in FIGS. 1A and 1B. In detail, FIGS. 1A and 1B show a pneumatically actuated membrane microfluidic valve 1 respectively in a first and in a second operating position (also defined, respectively, as closed position and open position hereinafter). In particular, the microfluidic valve 1 has, for example, a circular shape in top plan view with center O, the latter lying on a central axis S parallel to a Z axis of a Cartesian reference system XYZ.

The microfluidic valve 1 is formed in a first, a second, a third and a fourth layer 3, 5, 7, 9, superimposed on top of one another along the Z axis.

The first layer 3 is, for example, of glass and comprises an inlet channel 11, having main extension along a Y axis of the Cartesian reference system XYZ; in particular, the inlet channel 11 is fluidically connected to a reservoir (not shown), external to the microfluidic valve 1 and containing a fluid 12 (schematically shown in FIG. 1B), for example an ink or a solution with microparticles in suspension.

The second layer 5 is, for example, of silicon or plastic material and comprises a central channel 13, fluidically connected to the inlet channel 11 to receive, in use, the fluid 12 coming from the inlet channel 11.

The third layer 7 is of a flexible material, for example polymeric material (e.g., PDMS—PolyDimethylSiloxane), and is anchored to the second layer 5 by means of a peripheral portion 7'. The third layer 7 comprises an occluding portion 15; a cavity 17 surrounding the occluding portion 15 and having a height $H_C$ along the Z axis; an outlet channel 21, fluidically connected to the cavity 17 and delimited at the bottom by the second layer 5; and an outlet portion 22, delimiting the outlet channel 21 at the top. The third layer 7 further comprises a deformable portion 23 constituted by a membrane extending over the first cavity 17 between the peripheral portion 7' and the occluding portion 15.

The fourth layer 9 is of glass or plastic and is coupled to the third layer 7 at the peripheral portion 7' of the latter. In detail, the fourth layer 9 comprises a chamber 27; and an air channel 29, fluidically connected to the chamber 27 and to the external environment and configured to enable passage of air between the external environment and the inside of the chamber 27.

In use, the microfluidic valve 1 is controlled by an external control system (not shown), operatively coupled to the microfluidic valve 1 to switch between a closed position and an open position.

In particular, in the closed position, FIG. 1A, the air channel 29 enables passage of air from the external environment to the chamber 27 (arrow 30) to fill it; in this way, the air exerts a force downwards (along the Z axis) on the surface of the third layer 7, in particular on the occluding portion 15, so that the occluding portion 15 is in contact with the second layer 5 and thus closes the central channel 13. Therefore, the central channel 13 is fluidically isolated from the cavity 17 and from the outlet channel 21.

In this position, the deformable portion 23 is, in a first approximation, in a resting condition.

Consequently, any fluid 12 that may be present in the microfluidic valve 1 is blocked by the occluding portion 15 and cannot be ejected from the outlet channel 21.

To bring the microfluidic valve 1 into the open position, FIG. 1B, an external pump (not shown) sucks in the air contained in the chamber 27 through the air channel 29 (arrow 31) to create vacuum in the chamber 27; the air intake generates a force upwards (along the Z axis) which causes the movement of the occluding portion 15 and of the deformable portion 23 in the same direction.

Therefore, a fluidic path 33 is established between the central channel 13, the cavity 17, and the outlet channel 21 and allows the fluid 12, introduced into the inlet channel 11 and conveyed into the central channel 13, to flow towards the outlet channel 21 and thus to be ejected to the outside of the microfluidic valve 1 (arrows 32).

A further example of a magnetically actuated microfluidic valve is described in the Italian patent No. 1417932, corresponding to the U.S. Pat. No. 10,197,189.

The manufacturing processes currently used for producing the known microfluidic valves described above are not compatible with the integration processes of electronic components (such as heaters or pressure, temperature or flow-metering sensors) that are normally present in a microfluidic system.

Moreover, the manufacturing processes of known microfluidic valves are expensive.

BRIEF SUMMARY

The present disclosure provides, in various embodiments, a microfluidic valve and a manufacturing process thereof that overcome the drawbacks of the prior art.

According to the present disclosure a membrane microfluidic valve with piezoelectric actuation and a manufacturing process thereof are provided.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

Figure 1A:
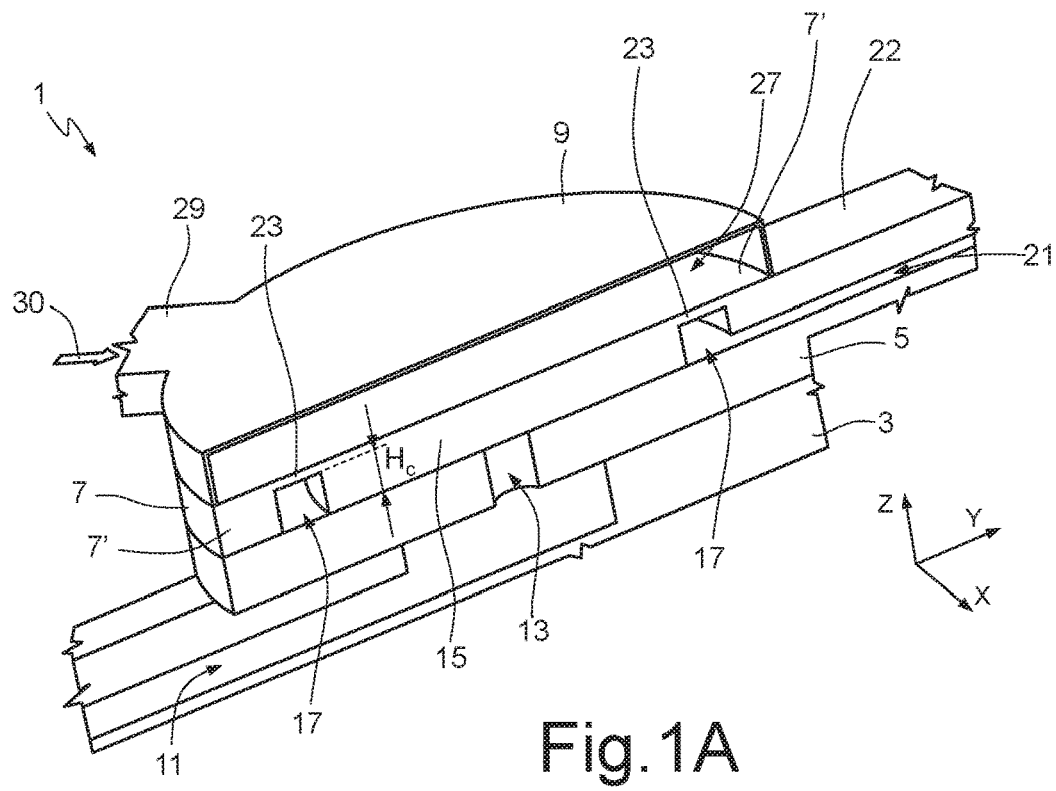
FIGS. 1A and 1B are simplified perspective cross-sections of a known microfluidic valve in various operating positions.
Figure 1B:
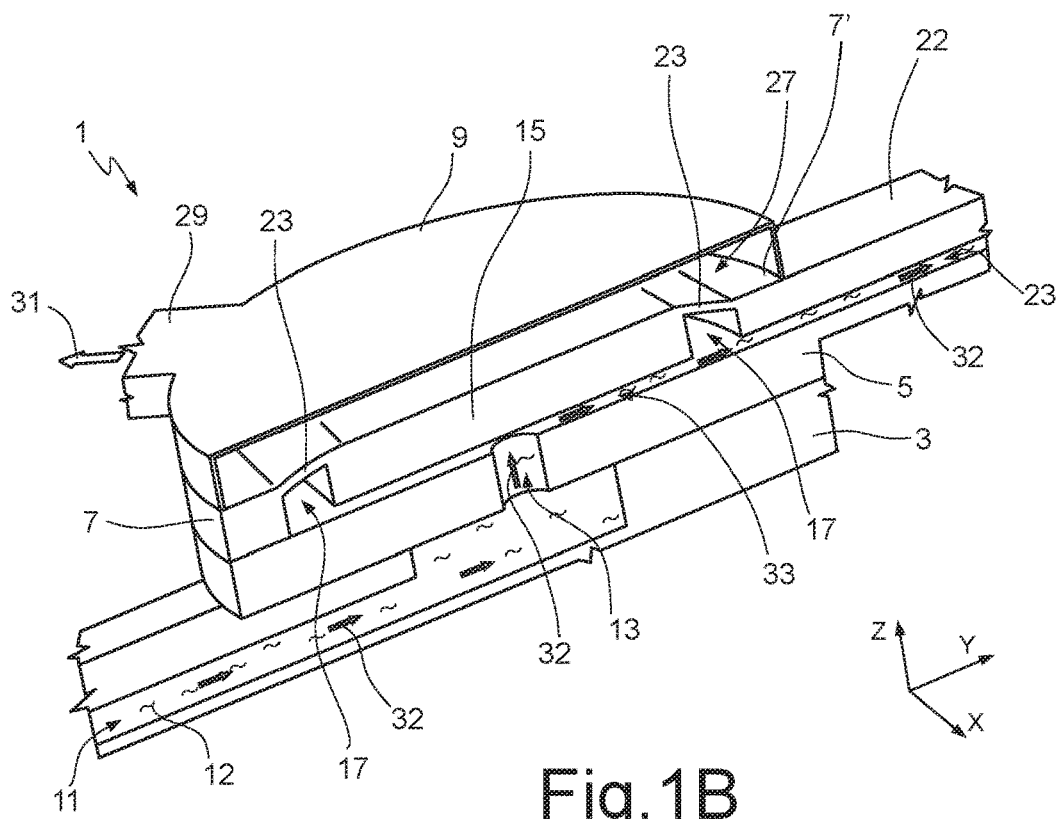
Figure 2:
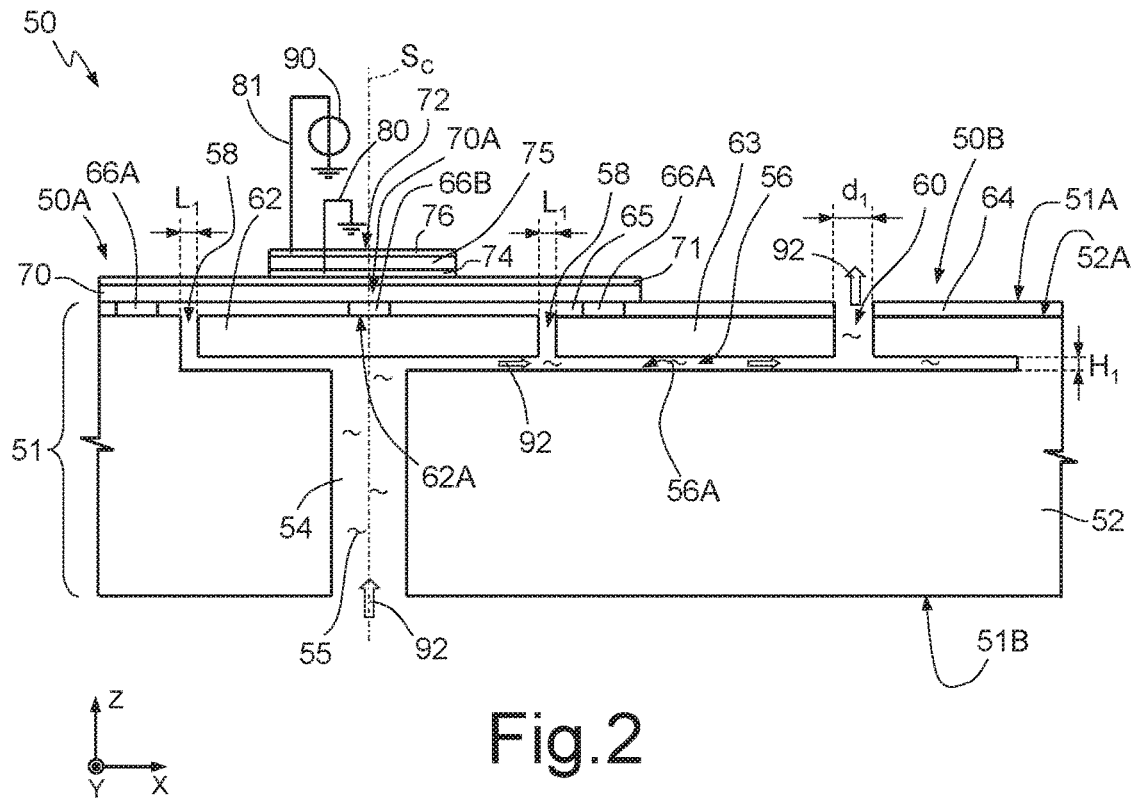
FIGS. 2 and 3 are simplified cross-sections of the present microfluidic valve according to an embodiment, in various operating positions.
Figure 3:
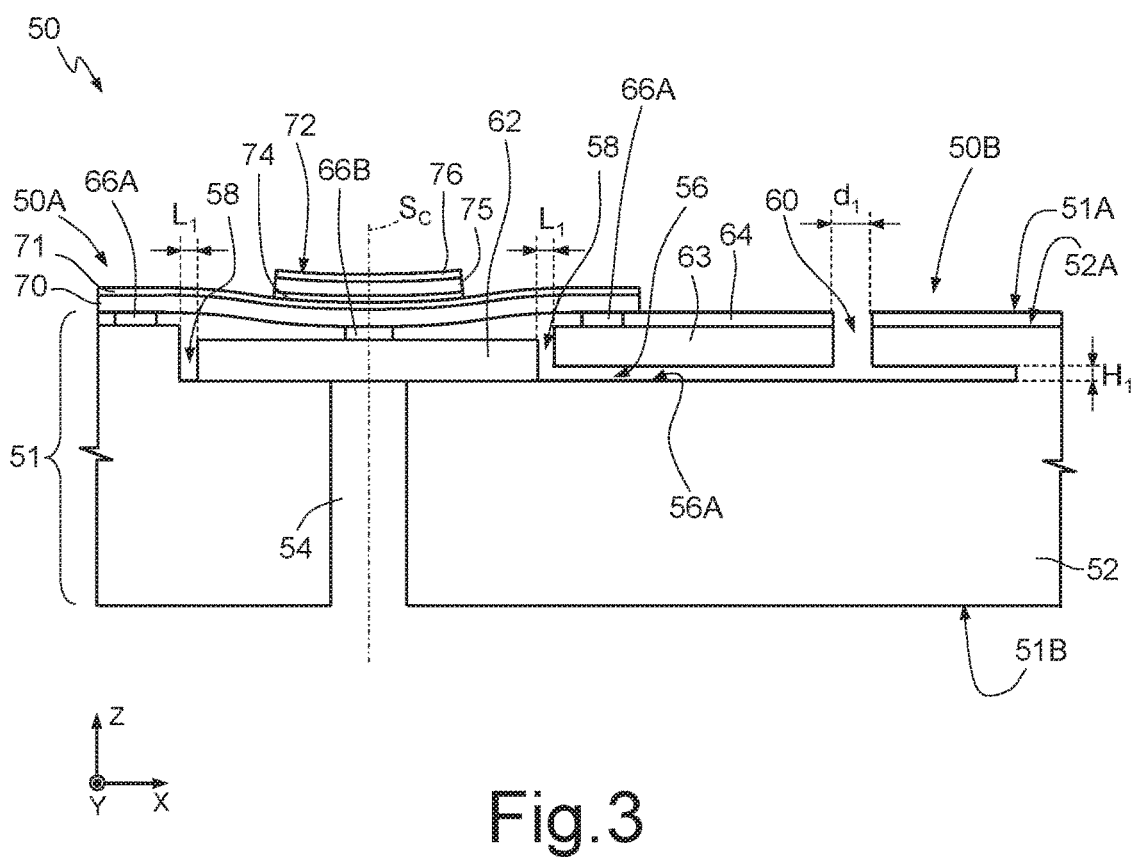

FIGS. 2-3 show a microfluidic valve 50 having a valve region 50A and an ejection region 50B, which is laterally arranged with respect to the valve region 50A.

The microfluidic valve 50 is formed in a body 51 having a first and a second surface 51A, 51B. In detail, the body 51 comprises a substrate 52 of semiconductor material (for example, silicon) and an insulating layer 64 of dielectric material (for example, silicon oxide, $SiO_2$). The substrate 52 is delimited at the bottom by the second surface 51B and at the top by a top surface 52A, and the insulating layer 64 extends on the top surface 52A of the substrate 52.

The substrate 52 comprises an inlet channel 54, extending in the substrate 52 from the second surface 51B in a direction parallel to the Z axis, indicated in the figure as local symmetry axis $S_C$; moreover, the inlet channel 54 is fluidically connected to a reservoir (not shown), external to the microfluidic valve 50 and configured to store a fluid 55, for example an ink or a solution with micrometric particles in suspension.

The substrate 52 further comprises a transverse channel 56, having main extension along an X axis of the Cartesian reference system XYZ, in a transverse direction, in particular perpendicular, to the inlet channel 54. The transverse channel 56 is fluidically connected to the inlet channel 54 and is configured to receive the fluid 55 introduced in the inlet channel 54 when the microfluidic valve 50 is in the operating position illustrated in FIG. 2. The transverse channel 56 is delimited at the bottom by a bottom surface 56A.

The substrate 52 further comprises a delimitation trench 58, for example of a circular shape with center along the local symmetry axis $S_C$, extending in the substrate 52 from the top surface 52A as far as the transverse channel 56 and being fluidically connected to the latter.

The substrate 52 further comprises an outlet channel 60 extending in the substrate 52 from the top surface 52A as far as the transverse channel 56 to be fluidically connected to the latter. The outlet channel 60 is configured to receive the fluid 55 introduced into the transverse channel 56 and to eject it outwards (for example, in a fluidic path, formed, for instance, by microtubes, and external to the microfluidic valve 50) when the microfluidic valve 50 is in the operating position illustrated in FIG. 2.

The substrate 52 further comprises an occluding portion 62 and a suspended portion 63 facing the bottom surface 56A of the transverse channel 56. In particular, the occluding portion 62 is laterally delimited by the delimitation trench 58 and thus has, for example, a circular shape in top plan view with center on the local symmetry axis $S_C$. The suspended portion 63 extends laterally to the delimitation trench 58, between the latter and the outlet channel 60.

In the microfluidic valve 50, the transverse channel 56 may have a depth (in a direction parallel to the Z axis, also defined as height $H_1$ hereinafter) of, for example, 3 μm and a width (in a direction parallel to the X axis) of 1000 μm; the delimitation trench 58 and the outlet channel 60 may have a depth (in a direction parallel to the Z axis) of 5 μm; the delimitation trench 58 may have a width (distance between the major circumference and the minor circumference, also defined as width $L_1$ hereinafter) of 3 μm; the outlet channel 60 may have a diameter $d_1$ of, for example, 50 μm; and the occluding portion 62 may have a diameter, for example, between 100 μm and 200 μm.

The insulating layer 64, which covers the top surface 52A of the substrate 52, has an opening 65, superimposed on top of the occluding portion 62 and having a greater area than the latter, so that the top surface of the occluding portion 62 and part of the top surface 52A of the substrate 52, outside the delimitation trench 58, are without the insulating layer 64.

Moreover, supporting elements 66A and 66B, of semiconductor material (for example, polysilicon), extend on the top surface 52A within the opening 65 of the insulating layer 64. In particular, a first supporting element 66A has, for example, the shape of a circular ring, is externally arranged and surrounds the delimitation trench 58; a second supporting element 66B is arranged at a central portion 62A of the occluding portion 62.

A deformable element 70, of semiconductor material (for example, epitaxial silicon), extends on the first surface 51A, in particular on the opening 65 of the insulating layer 64 (and thus on the supporting elements 66A, 66B) and on the portion of the insulating layer 64 surrounding the opening 65. For example, the deformable element 70 has a circular shape in top plan view with center along the local symmetry axis $S_C$ and a diameter greater than that of the opening 65 and that of the occluding portion 62. For instance, the deformable element 70 has a diameter e.g., greater by 100 μm than the diameter of the occluding portion 62 and the opening 65 has a diameter e.g., greater by 50 μm than the diameter of the occluding portion 62. In this way, the deformable element 70, the opening 65, and the occluding portion 62, which extend on planes parallel to one another and to a XY plane of the Cartesian reference system XYZ, are aligned along the local symmetry axis $S_C$.

As shown in FIG. 2, the supporting elements 66A, 66B are interposed between the deformable element 70 and the top surface 52A so that the deformable element 70 is physically coupled to the substrate 52. In particular, the deformable element 70 and the occluding portion 62 are rigid with each other so that, in use (FIG. 3), a deformation of the deformable element 70 entails a movement along the Z axis of the occluding portion 62.

A piezoelectric actuator 72, having, for example, a circular shape with center along the local symmetry axis $S_C$, extends on the deformable element 70, in particular at the central portion 70A, and is formed by a stack of layers. In detail, the stack of layers comprises a first electrode 74, of conductive material; a piezoelectric region 75, for example, of PZT (Pb, Zr, $TiO_2$) or AlN, extending on the first electrode 74; and a second electrode 76, of conductive material, extending on the piezoelectric region 75. The first and the second electrode 74, 76 of the piezoelectric actuator 72 are electrically connected, respectively, to a voltage generator 90 and to ground through respective conductive pads 80, 81 (schematically shown in FIG. 2). Moreover, the first electrode 74 is electrically and physically insulated from the deformable element 70 by a dielectric layer 71, for example of $SiO_2$.

The microfluidic valve 50 operates according to the operating positions illustrated in FIGS. 2 and 3, respectively, and referred to respectively as opening position and closing position hereinafter.

In the opening position, FIG. 2, the first electrode 74 is connected to ground; in this way, the deformable element 70 and the occluding portion 62 are in an undeformed, resting condition. Therefore, the occluding portion 62 extends at a distance from the bottom surface 56A of the transverse channel 56 and the fluid 55 coming from the reservoir and introduced into the inlet channel 54 can freely flow in the transverse channel 56 and reach the outlet channel 60 (arrows 92) so that it can be ejected outside of the microfluidic valve 50 (for example, in an external fluidic path, formed, for instance, by microtubes).

To reach the closing position, FIG. 3, a potential difference, for example between 0 V and 100 V, in particular 40 V, is applied between the first and second electrodes 74, 76 by the voltage generator 90; therefore, the deformable element 70 and the occluding portion 62 are deflected downwards (i.e., towards the inside of the transverse channel 56). The occluding portion 62 thus comes into contact with the bottom surface 56A of the transverse channel 56, closing the mouth of the inlet channel 54 and thus fluidically isolating the inlet channel 54 from the transverse channel 56, as well as from the outlet channel 60. Therefore, the fluid 55 in the inlet channel 54 cannot be introduced into the transverse channel 56 and into the outlet channel 60 for ejection and, thus, cannot be ejected towards the outside of the microfluidic valve 50.

FIGS. 4-10 show successive steps of a manufacturing process of the microfluidic valve 50 of FIGS. 2-3.

Figure 4:
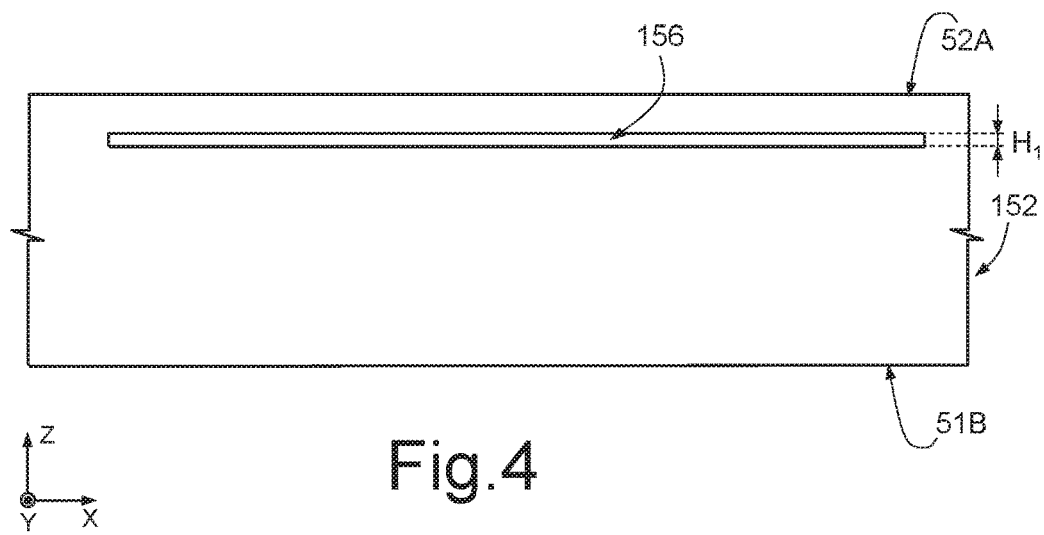
FIGS. 4-10 are simplified cross-sections of the microfluidic valve of FIGS. 2-3 in subsequent manufacturing steps.

Initially, FIG. 4, a wafer 152 of semiconductor material (for example, silicon), designed to form the substrate 52 of FIGS. 2-3 and thus having a top surface 52A and a bottom surface corresponding to the second surface 51B, is processed to form a buried cavity 156; in particular, the formation of the buried cavity 156 may be obtained in various ways, for example as taught in the European patent No. EP 1577656. The buried cavity 156 is designed to form the transverse channel 56 shown in FIGS. 2-3, and therefore has an extension in the direction of depth equal to the height $H_1$ of the transverse channel 56.

Figure 5:
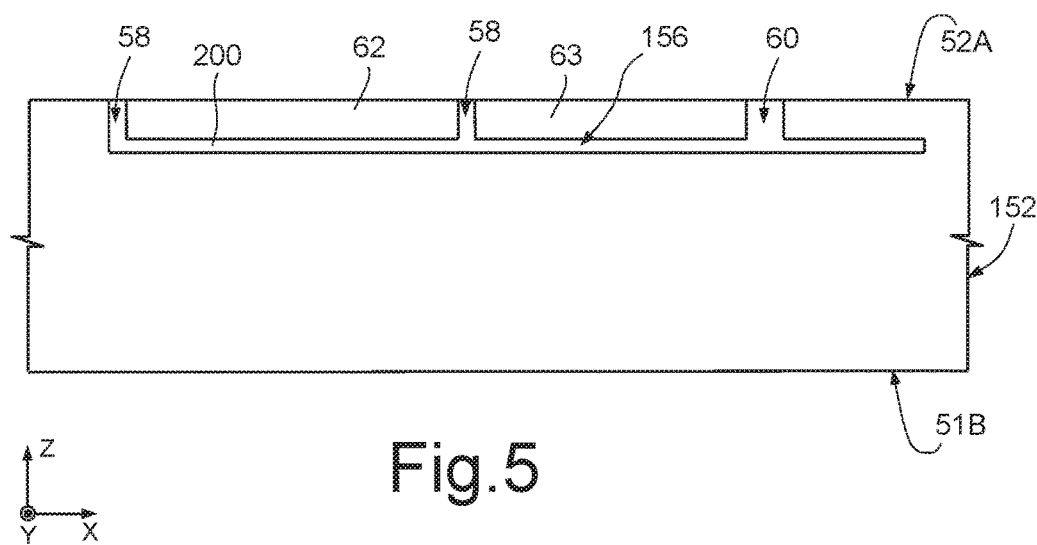

Then, FIG. 5, the wafer 152 is processed to form the delimitation trench 58 and the outlet channel 60; in particular, the delimitation trench 58 and the outlet channel 60 are formed according to known etching techniques of the wafer 152 (for example, dry etching, such as DRIE—Deep Reactive Ion Etching) starting from the top surface 52A. In detail, the etching proceeds until the buried cavity 156 is reached. In this way, the occluding portion 62 and the suspended portion 63 are formed in the wafer 152.

Next, the delimitation trench 58, the outlet channel 60 and the buried cavity 156 are filled by a filling layer 200 (for example, of $SiO_2$). In particular, the filling layer 200 is thermally grown, e.g., according to the modalities described in the U.S. Patent Application Publication No. 2008/0261345 A1. Preferably, the filling layer 200 completely fills the buried cavity 156.

Figure 6:
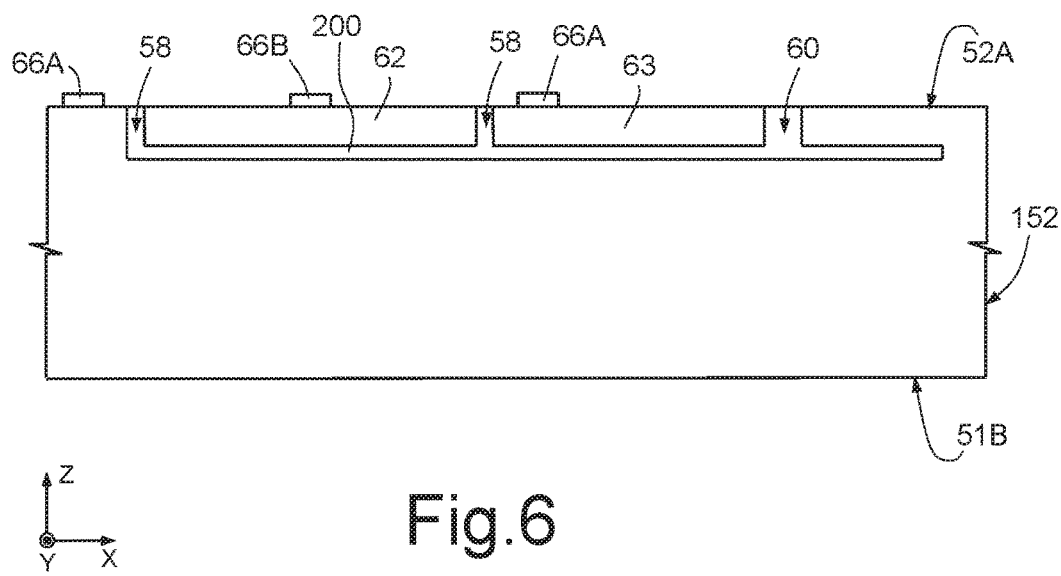

Then, FIG. 6, a polysilicon layer (not shown) is deposited and defined in a way in itself known to form the supporting elements 66A, 66B.

Figure 7:
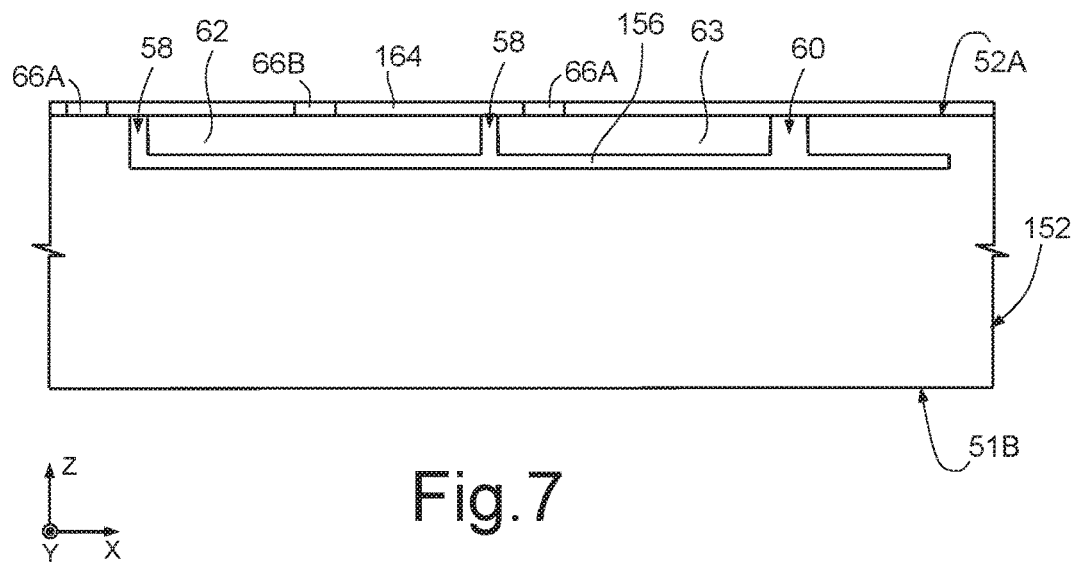

Next, FIG. 7, a coating layer, designed to form the insulating layer 64 shown in FIGS. 2-3, is deposited on the top surface 152A and on the supporting elements 66A, 66B and is processed using known grinding and polishing techniques, for example CMP (Chemical Mechanical Polishing) to reduce the thickness thereof. In particular, the grinding and polishing process proceeds until the thickness of the deposited coating layer reaches the thickness of the supporting elements 66A, 66B.

Figure 8:
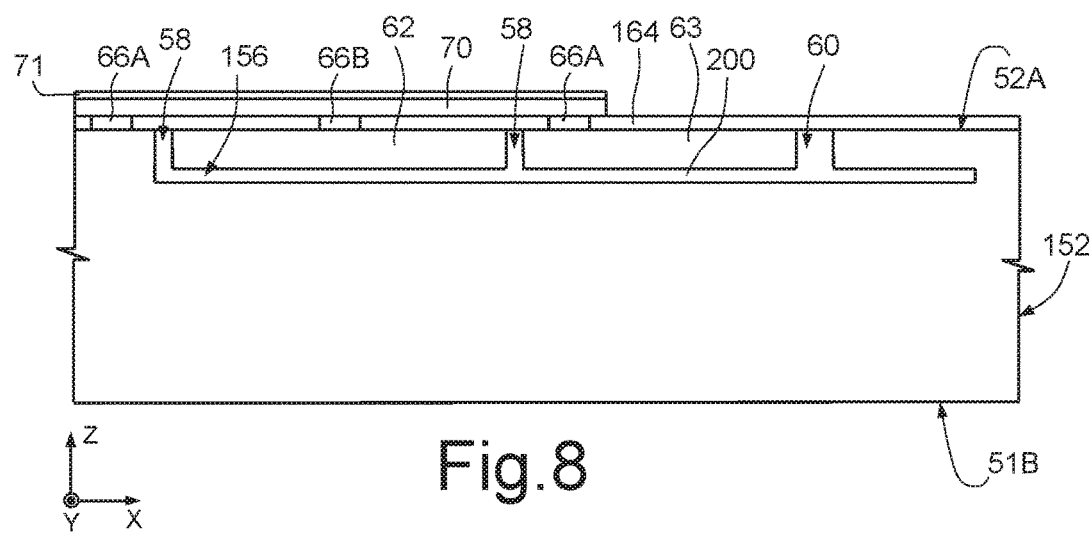
Figure 9:
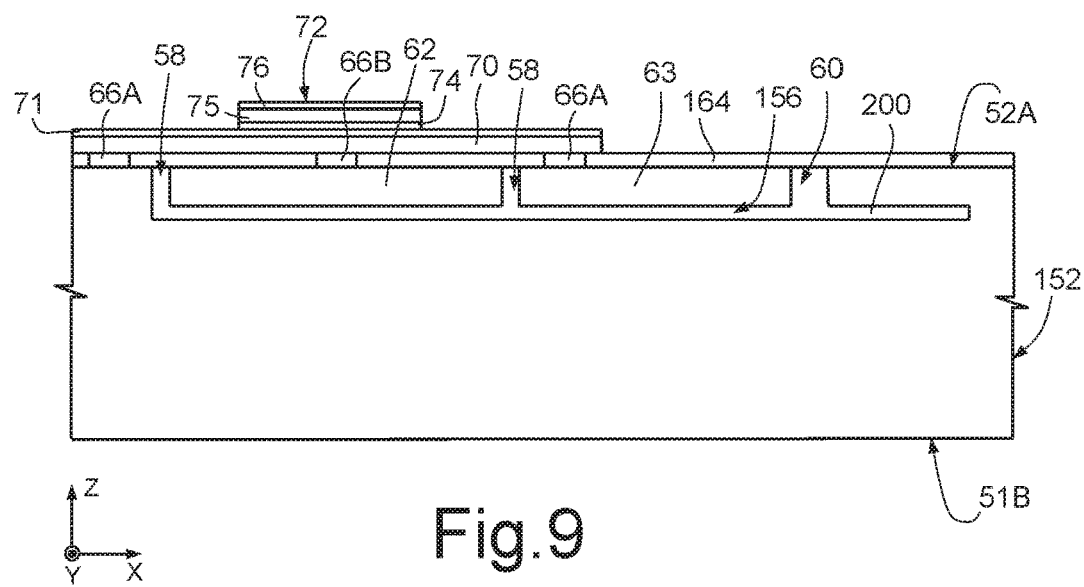

Then, FIG. 8, a semiconductor layer, for example, of polysilicon (not shown), is deposited and defined on the supporting elements 66A and 66B and on the insulating layer 64 to form the deformable element 70 of FIGS. 2-3. Next, the dielectric layer 71 is deposited on the deformable element 70 in a way in itself known. Then, FIG. 9, a first electrode layer, a piezoelectric material layer and a second electrode layer are deposited in succession on the deformable element 70 and are defined according to known techniques to form the first electrode 74, the piezoelectric region 75, and the second electrode 76 of the piezoelectric actuator 72, respectively. Then, the conductive pads 80, 81 of FIG. 2 are deposited on the dielectric layer 71 and defined according to known deposition and definition techniques.

Figure 10:
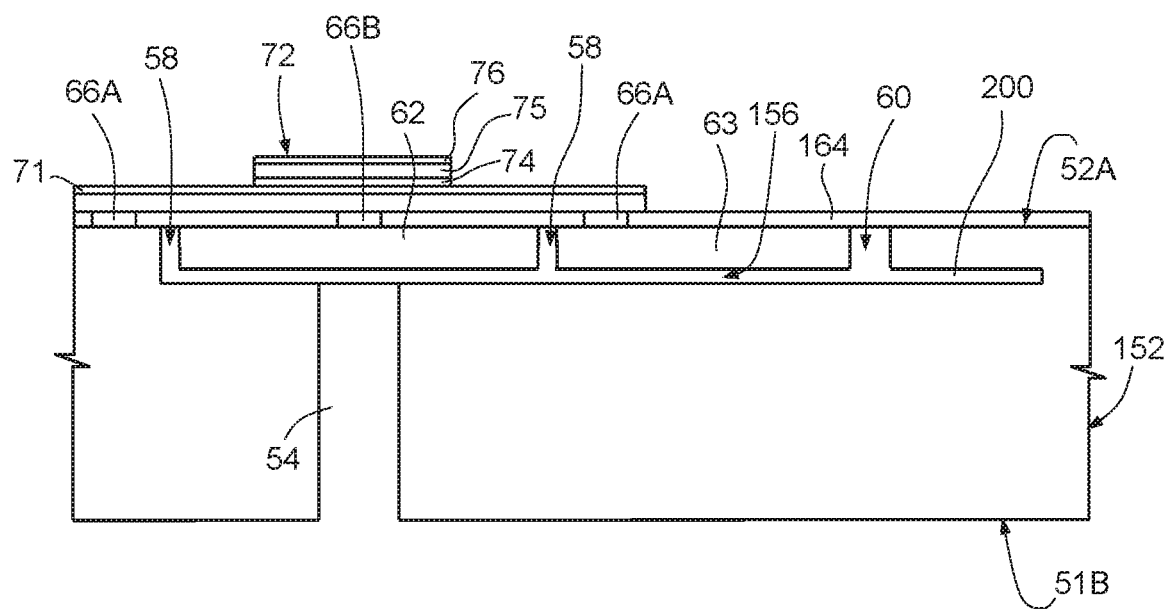

Then, FIG. 10, using a mask layer (not shown), the wafer 152 is etched from the second surface 51B using known etching techniques (for example, DRIE) to form the inlet channel 54. Next, by protecting the top surface of the wafer 152 with another mask layer, the filling layer 200 and part of the insulating layer 64 are etched through the inlet channel 54 by means of a wet etching step, for example using HF. In this way, the occluding portion 62, the suspended portion 63 and the deformable element 70 are released, and the transverse channel 56 is emptied.

After removal of the mask layers (not shown), the wafer 152 is diced to obtain the microfluidic valve 50 of FIGS. 2-3.

Figure 11:
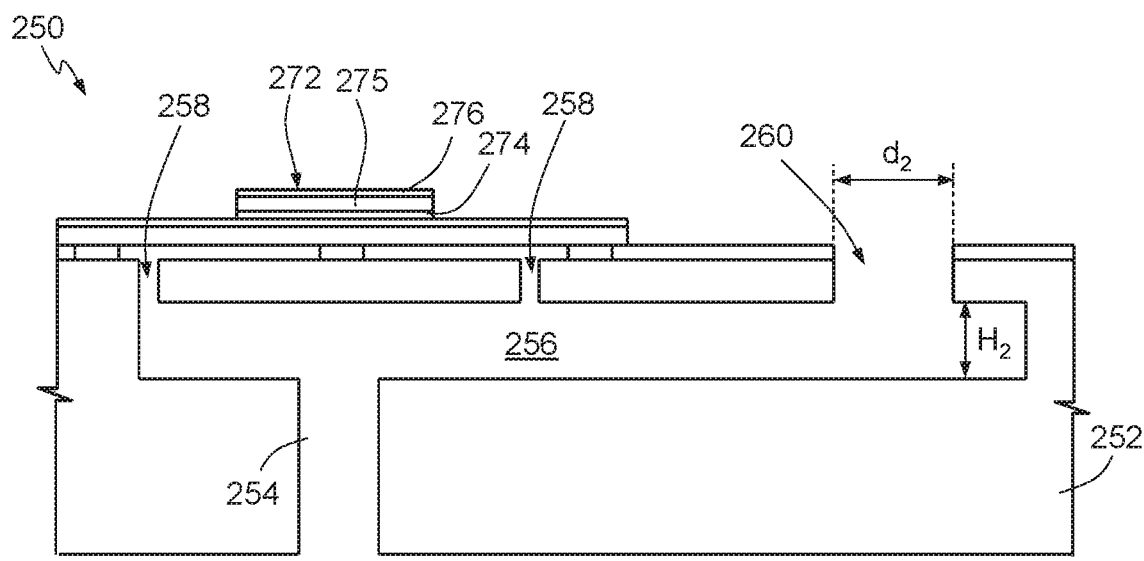
FIG. 11 is a simplified cross-section of the present microfluidic valve according to another embodiment.

FIG. 11 shows another embodiment of the present microfluidic valve. In detail, FIG. 11 shows a microfluidic valve 250 having a general structure similar to that of the microfluidic valve 50 of FIGS. 2-3, so that parts that are similar to the ones illustrated and described with reference to FIGS. 2-3 are designated in FIG. 11 by reference numbers increased by 200.

In particular, in the fluidic valve 250 of FIG. 11, the transverse channel 256 and the outlet channel 260 have greater dimensions than those of the microfluidic valve 50 of FIG. 2; in particular, the transverse channel 256 here has a height H2 (in a direction parallel to the Z axis) of, for example, 10 µm, and the outlet channel 260 has a diameter $d_2$, for example, of 10 µm.

In use, the microfluidic valve 250 of FIG. 11 operates in a way similar to what is described with reference to the microfluidic valve 50 of FIGS. 2-3. In greater detail, given the larger dimensions of the transverse channel 256, the potential difference to be applied between the first and second electrodes 274, 276 of the piezoelectric actuator 272 is comprised, for example, between 30 V and 40 V.

Figure 12:
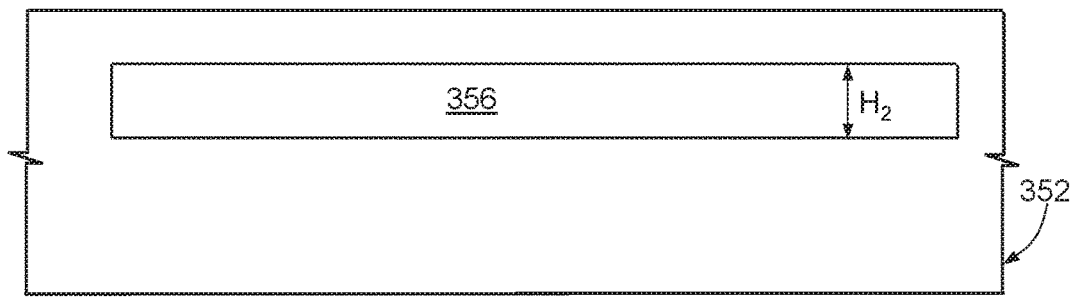
FIGS. 12-14 are simplified cross-sections of the microfluidic valve of FIG. 11 in subsequent manufacturing steps.
Figure 13:
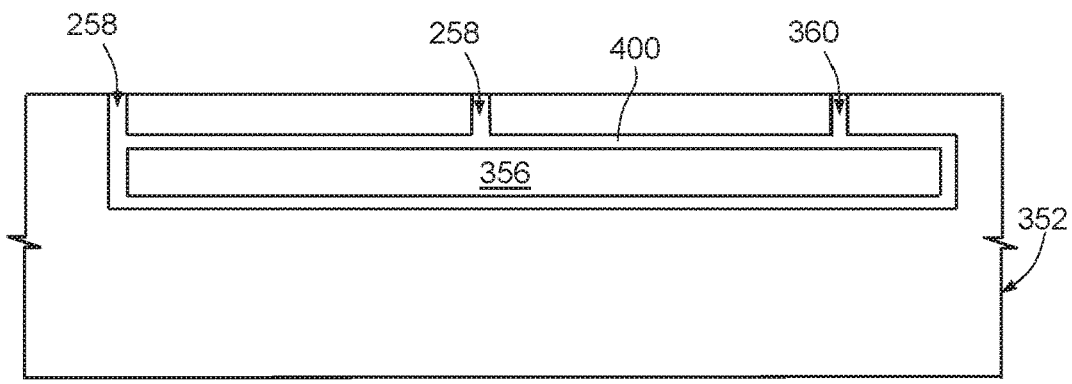
Figure 14:
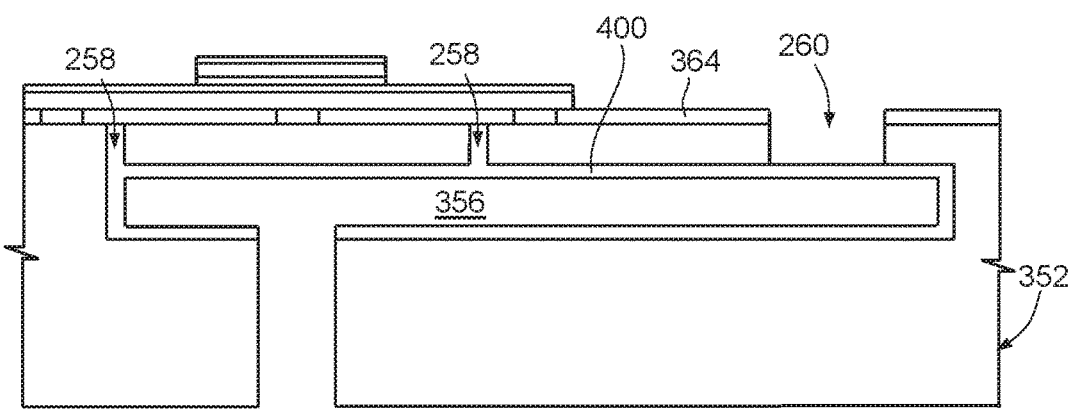

FIGS. 12-14 show successive steps of a part of a manufacturing process of the microfluidic valve 250 of FIG. 11. In particular, the manufacturing steps illustrated in FIGS. 12-13 are similar to the manufacturing steps illustrated in FIGS. 4-5 so that parts that are similar to the ones illustrated and described with reference to FIGS. 4-5 are designated in FIGS. 12-13 by reference numbers increased by 200.

Initially, FIG. 12, the wafer 352, designed to form the body 252, is processed to form a buried cavity 356, designed to form the transverse channel 256. In particular, the formation of the buried cavity 356 may be obtained in various ways, for example as taught in the European patent EP 1577656.

Then, FIG. 13, the wafer 352 is etched using known etching techniques (for example, DRIE) to form the delimitation trench 258 and an outlet trench 360, intended to form the outlet channel 260. In this step, the outlet trench 360 has a width approximately equal to that of the delimitation trench 258. As in FIG. 5, etching proceeds until the buried cavity 356 is reached. Next, the trenches 258 and 360 and the buried cavity 356 are filled by a filling layer 400 (for example, of $SiO_2$), thermally grown, e.g., according to the modalities described in the U.S. Patent Application Publication No. 2008/0261345 A1.

The subsequent manufacturing steps for the microfluidic valve 250 are similar to the manufacturing steps for the microfluidic valve 50 illustrated in FIGS. 6-10 and thus will not be described any further hereinafter.

Unlike the manufacturing process of the microfluidic valve 50, prior to the wet etching step for removing the filling layer 400 and, partially, the insulation layer 364, FIG. 14, an etching step is carried out to form the outlet channel 260. In particular, the known etching step (for example, DRIE) allows to increase the width of the outlet trench 360. In this way, formation of the outlet channel 260 is rendered independent of the requirements for formation of the filling layer 400 and of the insulating layer 364.

Then, the wafer 352 is processed according to the modalities presented with reference to FIG. 10, which, thus, will not be described any further.

The microfluidic valve 250 can advantageously be used, for example, for applications that employ fluids with micrometric particles in suspension (for instance, for treatment and analysis of biological material).

Figure 15:
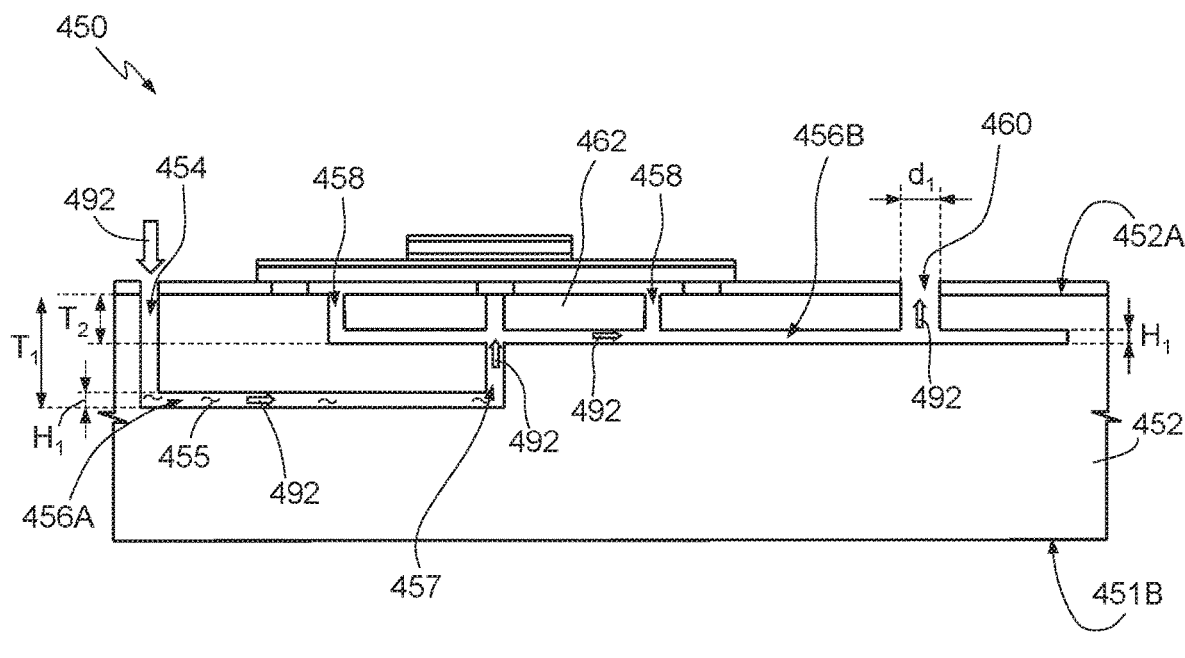
FIG. 15 is a simplified cross-section of the present microfluidic valve according to a further embodiment.

FIG. 15 shows a further embodiment of the present microfluidic valve. In detail, FIG. 15 shows a microfluidic valve 450 having a general structure similar to that of the microfluidic valve 250 of FIG. 11, so that parts that are similar to the ones illustrated and described with reference to FIG. 11 are designated in FIG. 15 by reference numbers increased by 200.

In particular, the substrate 452 comprises a first and a second transverse channel 456A, 456B, each having main extension along the X axis of the Cartesian reference system XYZ and a height $H_1$. In particular, the first transverse channel 456A extends in the substrate 452 at a first depth $T_1$ (in the direction of the Z axis), for example equal to 50 μm. The second transverse channel 456B extends in the substrate 452 at a second depth $T_2$, less than the first depth $T_1$, for example equal to 30 μm; moreover, the second transverse channel 456B has a length (along the X axis) greater than the length of the first transverse channel 456A, for example 1000 μm. The first and second transverse channels 456A, 456B are misaligned along the X axis, and the first transverse channel 456A projects on a side with respect to the second transverse channel 456B, in the valve region 450A.

Here, the inlet channel 454 extends in the body 452 from the top surface 452A, laterally to the delimitation trench 458, up to the first transverse channel 456A.

The substrate 452 further has a central channel 457 extending in the substrate 452 from the first surface 452A in the direction of the Z axis as far as the first transverse channel 456A. The central channel 457, which constitutes a coupling channel and has the purpose of fluidically connecting the first and second transverse channels 456A, 456B, here traverses the occluding portion 462 and has a width similar to that of the delimitation trench 458.

In use, the microfluidic valve 450 operates in a way similar to what is described with reference to the microfluidic valves 50, 250 of FIGS. 2-3 and 11.

In detail, in the open condition of the microfluidic valve 450, the fluid 455, coming from the external reservoir, flows from the inlet channel 454 through the first transverse channel 456A, the central channel 457, and the second transverse channel 456B, as far as the outlet channel 460 (arrows 492).

Figure 16:
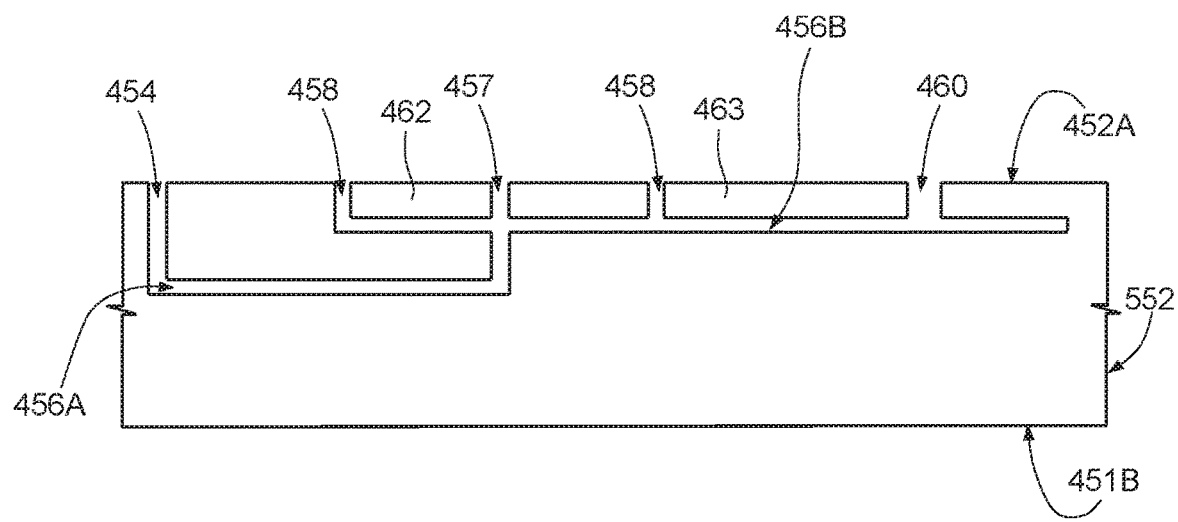
FIG. 16 is a simplified cross-section of the microfluidic valve of FIG. 15 in an intermediate manufacturing step.

FIG. 16 schematically shows a manufacturing step for the microfluidic valve 450 of FIG. 15. In detail, the manufacturing step of FIG. 15 is similar to the manufacturing step of FIG. 4 so that parts that are similar to the ones illustrated and described with reference to FIG. 4 are designated in FIG. 16 by reference numbers increased by 400.

In detail, the wafer 552, intended to form the substrate 452 and thus delimited at the top by the top surface 452A and at the bottom and by the second surface 451B, is processed to obtain the first and second transverse channels 456A, 456B. In particular, the first and second transverse channels 456A, 456B are obtained in two distinct steps, as taught, for example, in the European patent EP 1577656; in this case, first the first transverse channel 456A is obtained, and then, after a step of epitaxial growth, the second transverse channel 456B is obtained.

Then, using known etching techniques (for example, dry etching, such as DRIE), the wafer 552 is processed to form the delimitation trench 458, the inlet channel 454, the outlet channel 460, and the central channel 457. In particular, the etching step for obtaining the trench 458 and the outlet channel 460 proceeds until the second buried cavity 456B is reached; moreover, the etching step for obtaining the inlet channel 454 and the central channel 457 proceeds until the first buried cavity 456A is reached. In this way, the occluding portion 462 and the suspended portion 463 are formed.

The subsequent manufacturing steps for the microfluidic valve 450 are similar to the manufacturing steps for the microfluidic valves 50, 250 of FIGS. 4-10 and 12-13, respectively, and, thus, will not be described any further hereinafter.

Figure 17:
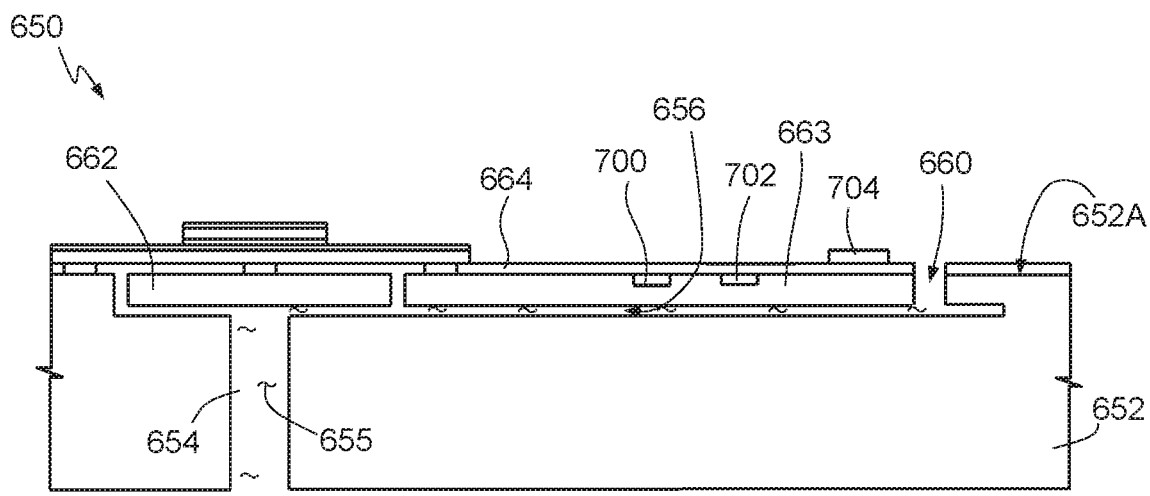
FIG. 17 is a simplified cross-section of the present microfluidic valve according to another embodiment.

FIG. 17 shows another embodiment of the present microfluidic valve. In detail, FIG. 17 shows a microfluidic valve 650 having a general structure similar to that of the microfluidic valve 50 of FIGS. 2-3 so that parts that are similar to the ones illustrated and described with reference to FIGS. 2-3 are designated in FIG. 17 by reference numbers increased by 600.

In particular, the microfluidic valve 650 comprises a first and a second piezoresistive element 700, 702, obtained, for example, by ion implantation of dopant species, such as boron (in case of a P-type implantation) or phosphorous (in case of a N-type implantation) formed in the substrate 652 adjacent to the top surface 652A, at the suspended portion 663. In use, the first and second piezoresistive elements 700, 702 are configured to detect the force exerted by the fluid 655 on the surface of the suspended portion 663 facing the transverse channel 656 when the fluid 655 flows in the transverse channel 656 towards the outlet channel 660.

Moreover, the microfluidic valve 650 comprises a heater element 704, of conductive material (for example, metal or polysilicon), extending on the insulating layer 664, in particular at the suspended portion 663 and at a distance from the first and second piezoresistive elements 700, 702 (in particular, in proximity of the outlet channel 660 to heat the fluid 655 prior to ejection from the outlet channel 660). This may be useful in some applications where it is desirable for the injected fluid to have a temperature higher than room temperature, such as for DNA analyses (DNA chips) or testing of biological specimens.

The microfluidic valve 650 is manufactured according to the manufacturing process illustrated in FIGS. 4-10 with reference to the microfluidic valve 50 and, thus, will not be described any further. In addition to the manufacturing steps illustrated in FIGS. 4-10, further steps for obtaining the first and second piezoresistive elements 700, 702 and the heater element 704 are carried out in a way in itself known.

Figure 18:
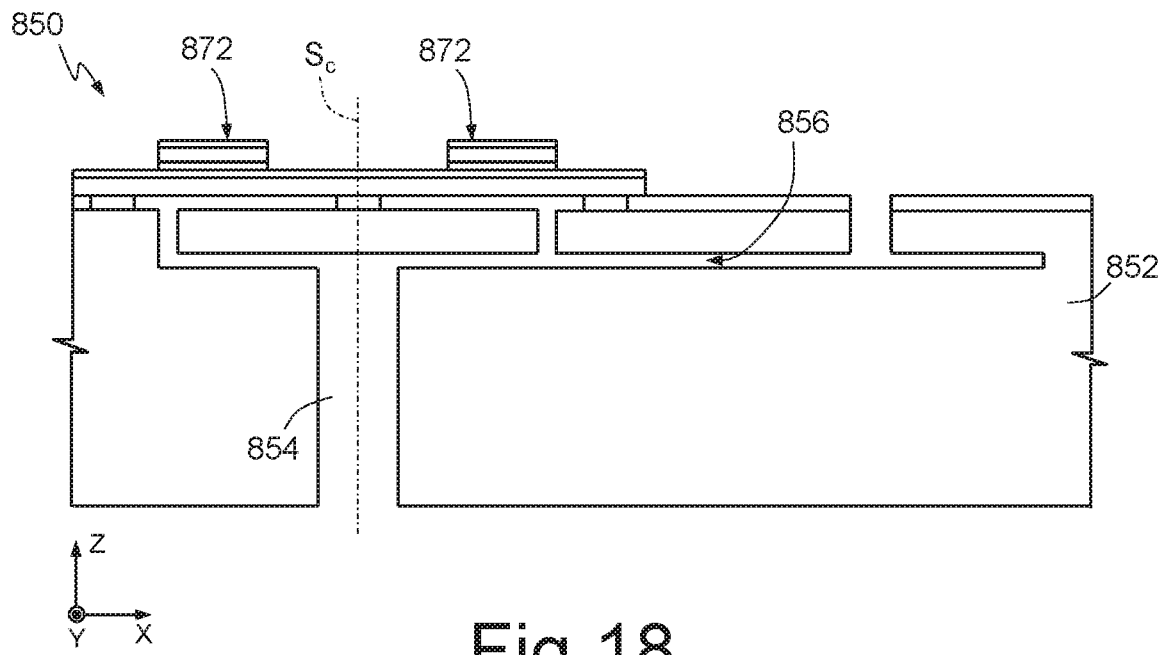
FIG. 18 is a simplified cross-section of the present microfluidic valve according to a further embodiment.

FIG. 18 shows a further embodiment of the present microfluidic valve. In detail, FIG. 18 shows a microfluidic valve 850 having a general structure similar to that of the microfluidic valve 50 of FIGS. 2-3, so that parts that are similar to the ones illustrated and described with reference to FIGS. 2-3 are designated in FIG. 17 by reference numbers increased by 800.

In particular, the piezoelectric actuator 472 is here shaped, like a circular ring in top plan view with center on the local symmetry axis $S_C$.

In use, the microfluidic valve 850 operates in a way similar to what is described with reference to the microfluidic valves 50, 250, 450, 650 of FIGS. 2-3, 11, 15, and 17, except for the fact that the first and second electrodes 474, 476 are biased in an opposite way to what described with reference to FIGS. 2-3, 11, 15, and 17.

The present microfluidic valve and the manufacturing process thereof have various advantages.

In particular, the present microfluidic valve may be obtained in a simple and inexpensive way, using process steps compatible with the manufacturing steps currently used for producing electronic integrated components used in microfluidic systems; therefore, it is possible to integrate further manufacturing steps in the manufacturing process of the described microfluidic valve to obtain one or more electronic components.

Finally, it is clear that modifications and variations may be made to the microfluidic valve and to the manufacturing process described and illustrated herein, without departing from the sphere of protection of the present disclosure.

For instance, the various embodiments described herein may be combined to provide further solutions; for example, it is possible to combine the embodiments of FIGS. 11 and 15 with the embodiment of FIG. 17. Alternatively, the microfluidic valves 50, 250, 650, 850 may comprise an inlet channel 54, 254, 654, 854 extending in the substrate 52, 252, 652, 852 from the top surface 52A, 252A, 652A, 852A, in a similar way to what is described for the microfluidic valve 450 of FIG. 15, and just the transverse channel 56, 256, 656, 856.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microfluidic valve comprising:
   a body, having a first and a second surface;
   an inlet channel, extending in the body from the first or the second surface;
   a first transverse channel, extending in the body in a transverse direction with respect to the inlet channel, the first transverse channel being fluidically coupled to the inlet channel;
   an outlet channel, extending in the body from the first surface and being fluidically coupled to the first transverse channel, the inlet channel, the first transverse channel and the outlet channel forming a fluidic path;
   an occluding portion, formed in the body and extending over the first transverse channel;
   a trench, formed in the body, the occluding portion being delimited by the trench, a portion of the trench extending over the first transverse channel;
   a suspended portion, formed in the body and extending over the first transverse channel, the suspended portion spaced laterally apart from the occluding portion by the trench, the outlet channel spaced laterally apart from the occluding portion by the suspended portion; and
   a piezoelectric actuator coupled to the occluding portion and configured to move the occluding portion between an opening position of the microfluidic valve, where the occluding portion does not interfere with the fluidic path, and a closing position of the microfluidic valve, where the occluding portion interferes with the fluidic path.

2. The microfluidic valve according to claim 1, further comprising a deformable element, extending on the first surface of the body and coupled to the piezoelectric actuator, the deformable element being rigid with the occluding portion.

3. The microfluidic valve according to claim 2, wherein the body comprises:
   a substrate of semiconductor material, delimited by a top surface and by the second surface, wherein
   the inlet channel, the first transverse channel, the outlet channel, and the trench extend in the substrate, and
   the trench extends in the substrate from the top surface to the first transverse channel.

4. The microfluidic valve according to claim 3, wherein the inlet channel extends in the substrate from the second surface to the first transverse channel.

5. The microfluidic valve according to claim 3, wherein the inlet channel extends in the substrate from the top surface to the first transverse channel.

6. The microfluidic valve according to claim 5, wherein the first transverse channel extends in the substrate at a first depth from the top surface and wherein the fluidic path further comprises:
   a second transverse channel, extending in the substrate at a second depth from the top surface, the second transverse channel being fluidically coupled to the first transverse channel; and
   a coupling channel, extending in the substrate between the first and the second transverse channel,
   wherein the second depth is smaller than the first depth.

7. The microfluidic valve according to claim 3, further comprising:
   a first supporting element of semiconductor material, extending on the top surface of the substrate, outside the trench, and being configured to couple the deformable element to the substrate; and
   a second supporting element of semiconductor material, extending on the top surface of the substrate and being configured to couple the deformable element to the occluding portion.

8. The microfluidic valve according to claim 7, further comprising an insulating layer of dielectric material, extending on the top surface of the substrate, the insulating layer having an opening above the occluding portion and the trench and housing the first supporting element.

9. The microfluidic valve according to claim 3, further comprising piezoresistive elements, extending in the substrate from the top surface, laterally to the occluding portion.

10. The microfluidic valve according to claim 3, further comprising heater elements of conductive material, extending on the top surface of the substrate, laterally to the occluding portion.

11. The microfluidic valve according to claim 2, wherein a first end of the deformable element is coupled to the suspended portion and a second end of the deformable element is coupled to the first surface of the body.

12. The microfluidic valve according to claim 11, further comprising:
 a first support connected between the suspended portion and the deformable element; and
 a second support connected between the first surface of the body and the deformable element.

13. A manufacturing process of a microfluidic valve, comprising:
 forming a first transverse channel in a substrate of semiconductor material;
 forming an outlet channel, extending in the substrate from a first surface of the substrate and being fluidically coupled to the first transverse channel;
 forming an inlet channel, extending in the substrate from the first or from a second surface of the substrate, the inlet channel being fluidically coupled to the first transverse channel and forming a fluidic path with the first transverse channel and the outlet channel;
 forming, in the substrate, an occluding portion extending between the first surface and the first transverse channel;
 forming, in the substrate, a suspended portion extending between the first surface and the first transverse channel, the suspended portion spaced laterally apart from the occluding portion;
 forming an insulating layer on the first surface;
 forming an opening in the insulating layer;
 forming at least one supporting element in the opening;
 forming a deformable element on the first surface, rigid with the occluding portion, the deformable element being coupled to the supporting element;
 forming, on the deformable element, a piezoelectric actuator configured to move the occluding portion from an opening position of the microfluidic valve, where the occluding portion does not interfere with the fluidic path, and a closing position of the microfluidic valve, where the occluding portion interferes with the fluidic path.

14. The process according to claim 13, wherein forming the first transverse channel comprises forming a first buried cavity, wherein the inlet channel extends from the first surface to the first buried cavity and the outlet channel extends from the first surface of the substrate to the first buried cavity.

15. The process according to claim 14, wherein forming the occluding portion comprises forming a trench in the substrate from the first surface to the first buried cavity, the trench laterally delimiting the occluding portion.

16. The process according to claim 14, wherein the first buried cavity is formed at a first depth from the first surface, the process further comprising:

after forming the first buried cavity, forming a second buried cavity configured to form a second transverse channel, the second buried cavity being formed at a second depth from the first surface; and
 forming a coupling channel in the substrate from the first surface, a central channel traversing the occluding portion and extending between the first and the second buried cavity,
 wherein the first depth is greater than the second depth, the first buried cavity laterally projects with respect to the second buried cavity with a projecting portion and the inlet channel extends from the first surface to the projecting portion of the first buried cavity.

17. The microfluidic valve according to claim 1, wherein the piezoelectric actuator includes an opening that directly overlies the occluding portion.

18. A microfluidic valve, comprising:
 a body having a first and a second surface, the body including a substrate delimited by a third surface and the second surface;
 an inlet channel extending in the body from the first or the second surface;
 a first transverse channel extending in the body in a transverse direction with respect to the inlet channel, the first transverse channel being fluidically coupled to the inlet channel;
 an outlet channel extending in the body from the first surface and being fluidically coupled to the first transverse channel, the inlet channel, the first transverse channel, and the outlet channel extending in the substrate and forming a fluidic path;
 an occluding portion in the body and extending over the transverse channel;
 a suspended portion in the body and extending over the transverse channel, the suspended portion spaced laterally apart from the occluding portion;
 a trench extending in the substrate from the third surface to the first transverse channel, the trench laterally delimiting the occluding portion;
 a deformable element on the first surface, the deformable element being rigid with the occluding portion;
 a first supporting element on the third surface and outside the trench, the deformable element and the substrate being coupled to each other by the first supporting element;
 a second supporting element on the third surface, the deformable element and the occluding portion being coupled to each other by the second supporting element; and
 a piezoelectric actuator on the deformable element, and configured to move the occluding portion between an opening position of the microfluidic valve, where the occluding portion does not interfere with the fluidic path, and a closing position of the microfluidic valve, where the occluding portion interferes with the fluidic path.

19. The microfluidic valve of claim 18, wherein each of the substrate, the first supporting element, and the second supporting element include semiconductor material.

20. A microfluidic valve comprising:
 a body having a first and a second surface;
 an inlet channel extending in the body from the first or the second surface;
 a first transverse channel extending in the body in a transverse direction with respect to the inlet channel, the first transverse channel being fluidically coupled to the inlet channel;

an outlet channel extending in the body from the first surface and being fluidically coupled to the first transverse channel, the inlet channel, the first transverse channel, and the outlet channel forming a fluidic path;

an occluding portion in the body and extending over the transverse channel;

a suspended portion in the body and extending over the transverse channel, the suspended portion spaced laterally apart from the occluding portion;

a deformable element on the first surface, the deformable element being rigid with the occluding portion;

a first support coupled between the suspended portion and the deformable element;

a second support coupled between the first surface of the body and the deformable element; and a piezoelectric actuator on the deformable element, and configured to move the occluding portion between an opening position of the microfluidic valve, where the occluding portion does not interfere with the fluidic path, and a closing position of the microfluidic valve, where the occluding portion interferes with the fluidic path.

21. The microfluidic valve according to claim 20, wherein a first end of the deformable element is coupled to the suspended portion and a second end of the deformable element is coupled to the first surface.

* * * * *